US009689559B2

(12) United States Patent
Chang et al.

(10) Patent No.: US 9,689,559 B2
(45) Date of Patent: Jun. 27, 2017

(54) LED LIGHT CORE STRUCTURE

(71) Applicant: EDISON OPTO CORPORATION, New Taipei (TW)

(72) Inventors: Hao Yun Chang, New Taipei (TW); Yao-Chuan Hung, New Taipei (TW)

(73) Assignee: Edison Opto Corporation, New Taipei (TW)

( * ) Notice: Subject to any disclaimer, the term of this patent is extended or adjusted under 35 U.S.C. 154(b) by 203 days.

(21) Appl. No.: 14/665,297

(22) Filed: Mar. 23, 2015

(65) Prior Publication Data

US 2016/0131339 A1 May 12, 2016

(30) Foreign Application Priority Data

Nov. 6, 2014 (TW) .............................. 103138562 A

(51) Int. Cl.
*F21V 19/00* (2006.01)
*F21V 9/16* (2006.01)
*F21V 23/06* (2006.01)
*F21K 9/232* (2016.01)
*F21K 9/27* (2016.01)
*H05K 1/18* (2006.01)
*H01L 25/075* (2006.01)
(Continued)

(52) U.S. Cl.
CPC ............ *F21V 19/003* (2013.01); *F21K 9/232* (2016.08); *F21K 9/27* (2016.08); *F21V 9/16* (2013.01); *F21V 19/005* (2013.01); *F21V 23/06* (2013.01); *F21Y 2103/10* (2016.08); *F21Y 2107/00* (2016.08); *F21Y 2115/10* (2016.08); *H01L 25/0753* (2013.01); *H01L 2224/48137* (2013.01); *H05K 1/181* (2013.01); *H05K 2201/09072* (2013.01); *H05K 2201/1053* (2013.01); *H05K 2201/10106* (2013.01)

(58) Field of Classification Search
CPC ... F21K 9/27; F21K 9/232; F21V 9/16; F21V 19/003; F21V 19/005; F21V 19/045; F21V 23/09; F21Y 2101/00; F21Y 2103/10; F21Y 2105/16; F21Y 2107/00; F21Y 2107/50; F21Y 2115/10; H05K 1/181; H05K 2201/1053; H05K 2201/09072; H05K 2201/10106; H01L 25/0753; H01L 2224/48137
See application file for complete search history.

(56) References Cited

U.S. PATENT DOCUMENTS

2013/0235573 A1* 9/2013 Ricci .................. F21V 9/06
362/235

* cited by examiner

Primary Examiner — Stephen F Husar
(74) Attorney, Agent, or Firm — Winston Hsu

(57) ABSTRACT

An LED light core structure, which has better mechanical strength and good heat dissipation effect and is able to 360-degree project light. The LED light core structure includes a substrate having at least two faces. The substrate is formed with at least one opening communicating the two faces. LEDs are disposed on at least one of the two faces of the substrate at the opening, whereby the light emitted from the LEDs disposed on one of the two faces of the substrate can be projected through the opening to the opposite face of the substrate. Accordingly, the substrate can be made of metal material, whereby the substrate is unlikely to crack so that the ratio of good products is increased and the substrate can provide excellent heat dissipation effect for the LEDs. The conventional wolfram filament electrodes can be directly replaced with the LED light core structure.

20 Claims, 5 Drawing Sheets

(51) Int. Cl.
*F21Y 103/10* (2016.01)
*F21Y 115/10* (2016.01)
*F21Y 107/00* (2016.01)

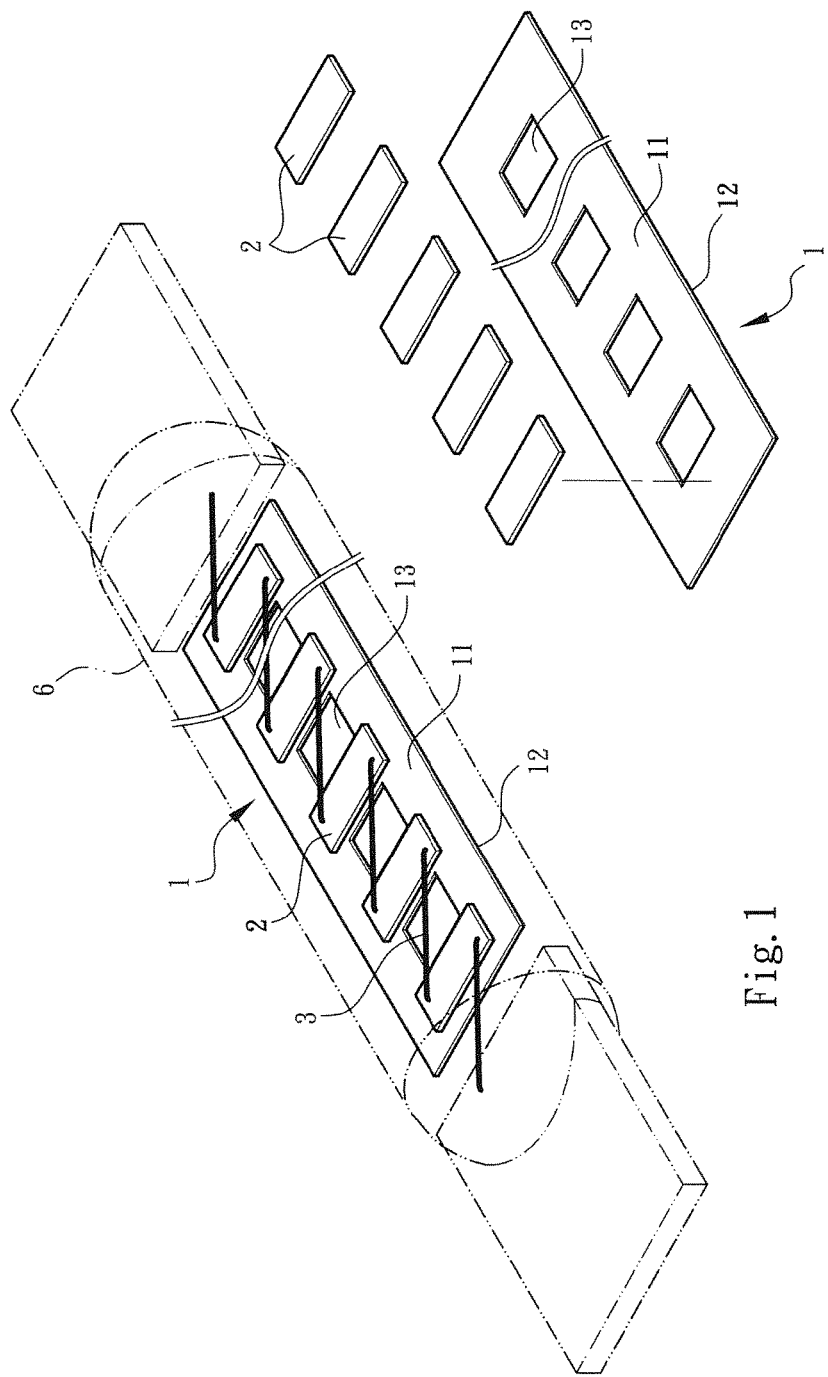

LED LIGHT CORE STRUCTURE

FIELD OF THE INVENTION

The present invention relates generally to a technique concerning fluorescent lamp tube, incandescent bulb and LED, and more particularly to an LED light core structure, which can be used to replace the conventional fluorescent lamp tube and the wolfram filament electrodes of the incandescent bulb. The LED light core structure includes a metal-made substrate and multiple LED mounted on the surfaces of the substrate.

BACKGROUND OF THE INVENTION

Currently, the illumination of homes, offices, classrooms and factories are mostly provided by fluorescent lamp tubes. In use, the incandescent bulbs are not such convenient as the fluorescent lamp tubes. However, the incandescent bulbs are still used in many situations to help in illumination as necessary. The fluorescent lamp tube is a glass tube body containing therein mercury and argon. Wolfram filament electrodes are sealed in the light caps at two ends of the tube body. After powered on, the wolfram filament electrodes can emit ultraviolet ray to energy the fluorescent powder coated on the inner wall face of the tube body so as to emit visible light. With respect to the incandescent bulb, the wolfram filament is sealed in the glass bulb. After powered, the wolfram filament is heated and incandesced to emit visible light. The prices of the fluorescent lamp tube and the incandescent bulb are both not very high. However, when the light core structure formed of the wolfram filament is powered on to emit light, the light core structure will consume quite a lot of electricity. Moreover, the mercury contained in the fluorescent lamp tube will contaminate the environment.

Therefore, from the viewpoint of energy saving and environmental protection, adoption of light-emitting diode (LED) is a very good substitution option for the conventional fluorescent lamp tube and incandescent bulb. However, before using the LED light to fully replace the incandescent bulb and fluorescent lamp tube, a problem must be overcome. That is, in the conventional LED light core structure, the LEDs are disposed on a printed circuit board. The printed circuit board is nontransparent. Therefore, in the case that the LEDs are disposed on the same face of the printed circuit board, the LED can only project light in one single direction without the possibility of 360-degree illumination. In the case that the LEDs are arranged on both faces of the printed circuit board, a 360-degree illumination effect can be achieved. However, the cost for the LED light core structure will be increased. Moreover, the light emitted from the LED on one face of the printed circuit board cannot pass through the printed circuit board to the other face thereof. Under such circumstance, the energy is wasted.

In view of the above, an improved LED light core structure has been developed. In the LED light core structure, the LEDs are disposed on a transparent substrate made of sapphire. The LEDs are arranged on one face of the sapphire substrate and the anodes and cathodes of the LEDs are connected to outer side of the LED light via fine metal leads for connecting with a power supply to power the LEDs. The light emitted from the LEDs can pass through the sapphire substrate to illuminate both sides of the sapphire substrate and achieve a 360-degree illumination effect.

However, in manufacturing, transfer and use process of the LED light core, the sapphire substrate is very likely to crack and break. Therefore, the ratio of good products is lowered. Moreover, the sapphire substrate has relatively poor heat conductivity. Therefore, the sapphire substrate can hardly provide good heat dissipation effect for the LED. As a result, the LED often burns down due to overheating. Accordingly, the reliability of the product is unstable. In addition, the sapphire substrate is an electrical insulator. Therefore, it is necessary to add metal electrodes to the positive and negative electrodes. It often takes place that the metal electrodes detach from the sapphire substrate. This further lowers the ratio of good products in the manufacturing process.

It is therefore tried by the applicant to provide an LED light core structure to overcome the above problems of the conventional LED light core structure.

SUMMARY OF THE INVENTION

It is therefore a primary object of the present invention to provide an LED light core structure, which has better mechanical strength and good heat dissipation effect and is able to 360-degree project light. The LED light core structure can be used to replace the conventional fluorescent lamp tube and the wolfram filament electrodes of the incandescent bulb. In contrast, the conventional sapphire substrate has poor heat dissipation effect and is likely to crack. The LED light core structure of the present invention overcomes the above problems of the conventional sapphire substrate. Moreover, the LED light core structure of the present invention is able to 360-degree project light.

To achieve the above and other objects, the LED light core structure of the present invention includes a substrate having at least two faces. The substrate is formed with at least one opening communicating the two faces. LEDs are disposed on at least one of the two faces of the substrate at the opening, whereby the light emitted from the LEDs disposed on one of the two faces of the substrate can be projected through the opening to the opposite face of the substrate.

In the above LED light core structure, the opening communicates the two faces of the substrate. Therefore, when the LEDs disposed on one of the faces of the substrate emit light, not only one of the faces is illuminated, but also the other face of the substrate is illuminated through the opening. Accordingly, the LEDs can provide 360-degree illumination effect. Therefore, the substrate can be made of metal material. The metal substrate can be formed with the opening without easy cracking and breakage. Therefore, the ratio of good products can be increased. Moreover, the metal-made substrate provides excellent heat dissipation effect for the LEDs. In contrast, the conventional sapphire substrate is likely to crack and break and has poor heat dissipation effect. The present invention overcomes the above problems of the conventional sapphire substrate. Moreover, the present invention is able to project light to two sides of the substrate. Therefore, the wolfram filament electrodes of the conventional fluorescent lamp tube and incandescent bulb can be directly replaced with the present invention to break through the limitation of the conventional LED lighting angle.

In the above LED light core structure, the substrate can be disposed in a light bulb or a lamp tube. A light cap is disposed at each of two ends of the lamp tube. The light cap has two conductive terminals electrically connected to the LEDs. The two conductive terminals of the light cap are respectively positioned on the two opposite faces of the substrate. The substrate and the LEDs are enclosed in an enclosure layer containing fluorescent powder. The LED light core structure is applicable to the existent specification of the conventional fluorescent lamp tube and incandescent bulb. Therefore, the LED light core structure can improve the shortcomings of the conventional light core structure formed of the wolfram filament.

In the above LED light core structure, the substrate is formed with multiple openings arranged on the substrate at intervals. Each LED is disposed on the face of the substrate between two adjacent openings. The LEDs are at least partially bridged over the openings. Alternatively, two ends of the LEDs are respectively bridged between two edges of the opening. The LEDs are arranged on the face of the substrate at equal or unequal intervals, whereby the substrate forms a light bar or light string. Moreover, the illumination angle of the LEDs can be changed in accordance with the requirements to provide various illumination forms.

The present invention can be best understood through the following description and accompanying drawings, wherein:

BRIEF DESCRIPTION OF THE DRAWINGS

FIG. 1 is a perspective view of a preferred embodiment of the present invention;

FIG. 2 is a perspective exploded view according to FIG. 1;

DETAILED DESCRIPTION OF THE PREFERRED EMBODIMENTS

Figure 3:
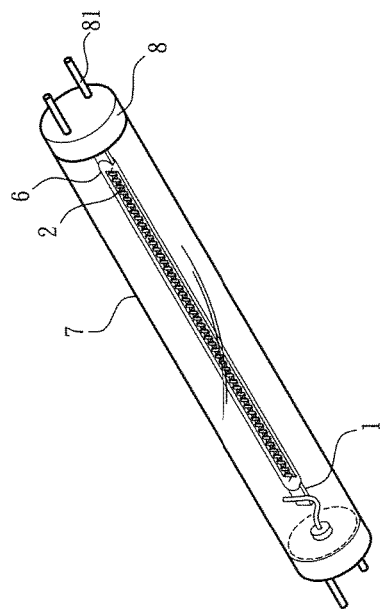
FIG. 3 is a perspective view showing a first application type of the embodiment of FIG. 1.

Please refer to FIGS. 1 and 2, which show a preferred embodiment of the LED light core structure of the present invention. According to this embodiment, the LED light core structure of the present invention includes an elongated substrate 1 having at least two faces 11, 12. The substrate 1 is formed with at least one opening 13 communicating the two faces 11, 12. In practice, the substrate 1 can be formed with multiple openings 13. The openings 13 are arranged on the two faces 11, 12 of the substrate 1 at equal intervals or unequal intervals. Each opening 13 has a rectangular form.

At least one LED 2 is disposed on at least one face 11 of the substrate 1 at the opening 13. In this embodiment, there are multiple LEDs 2. The LEDs 2 are respectively positioned between each two adjacent openings 13. The LEDs 2 are arranged on the face 11 of the substrate 1 at equal intervals or unequal intervals, whereby the substrate 1 forms a light bar or light string. The LEDs 2 are connected with each other by means of multiple metal leads 3.

To speak more specifically, two ends of each LED 2 respectively have an anode and a cathode. The anode and the cathode are not in contact with the substrate 1. The anodes of the LEDs 2 are directed in the same direction. The lead 3 is connected between the cathode of an LED 2 and the anode of another LED 2 and bridged over the opening 13. The LEDs 2 are connected in series. The leads 3 of the two outermost LEDs 2 are connected to external power supply for driving all the LEDs 2 to emit light. The light emitted from the LEDs 2 on one face 11 of the substrate 1 can be projected through the openings 13 to the opposite face 12 of the substrate 1.

Please refer to FIG. 3. The substrate 1 can be disposed in a light bulb 4. The light bulb 4 is connected with a light cap 5. The leads 3 of the two outermost LEDs 2 are connected to the light cap 5. The substrate 1 and the LEDs 2 are enclosed in an enclosure layer 6 containing fluorescent powder. According to the above arrangement, the opening 13 communicates the two faces 11, 12 of the substrate 1. Therefore, when the LEDs 2 disposed on one face 11 of the substrate 1 emit light, not only the face 11 of the substrate 1 is illuminated, but also the other face 12 of the substrate 1 is illuminated through the openings 13. Accordingly, the LEDs 2 can provide 360-degree illumination effect. Moreover, the light emitted from the LEDs 2 can energize the enclosure layer 6 coated on the substrate 1 and the LEDs 2 to enhance the brightness and uniformity of the light.

Figure 4:
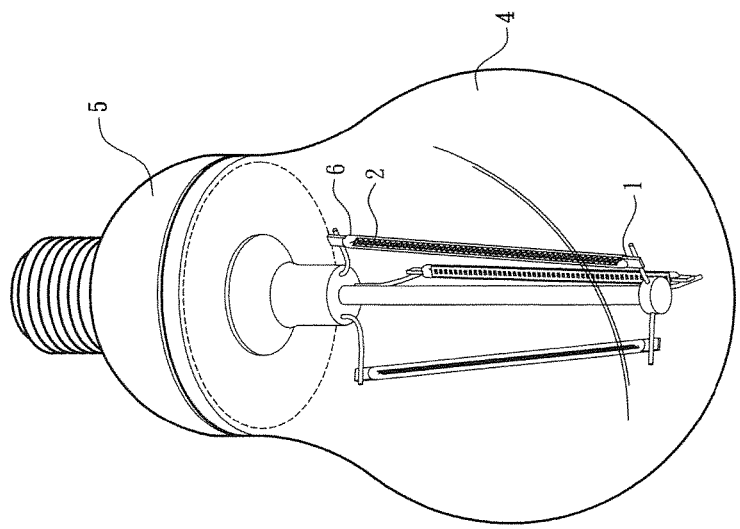
FIG. 4 is a perspective view showing a second application type of the embodiment of FIG. 1.

Please refer to FIG. 4. Alternatively, the substrate 1 can be disposed in a lamp tube 7. A light cap 8 is disposed at each of two ends of the lamp tube 7. Two ends of the substrate 1 are respectively fixed in the light caps 8. Each light cap 8 has two conductive terminals 81. The leads 3 of the two outermost LEDs 2 are electrically connected to the conductive terminals 81 via the light caps 8. The conductive terminals 81 of the light caps 8 are respectively positioned on the two opposite faces 11, 12 of the substrate 1. Accordingly, when the conductive terminals 81 of two sides of the lamp tube 7 are connected to an external power supply, the power can supplied through the leads 3 to the LEDs 2 to drive the LEDs 2 on one face 11 of the substrate 1 to emit light. The light emitted from the LEDs 2 on one face 11 of the substrate 1 can be projected through the openings 13 to the other face 12 of the substrate 1. Accordingly, the LEDs 2 can provide 360-degree illumination effect.

It should be noted that the two conductive terminals 81 of the light cap 8 are respectively positioned on the two opposite faces 11, 12 of the substrate 1. Therefore, after the lamp tube 7 is installed on a light holder (not shown) of a ceiling, the two faces 11, 12 of the substrate 1 are right directed to two sides of the light holder. In this case, neither the face 11 nor the face 12 of the substrate 1 will be directed to the ceiling. Accordingly, the light of both faces 11, 12 of the substrate 1 can be used to fully illuminate an area under the ceiling.

Accordingly, the substrate 1 can be made of metal material. The metal substrate 1 can be punched to form the openings 13 without easy cracking and breakage. Therefore, the ratio of good products can be increased. Moreover, the metal-made substrate 1 can provide excellent heat dissipation effect for the LEDs 2. In contrast, the conventional sapphire substrate is likely to crack and break and has poor heat dissipation effect. The present invention overcomes the above problems of the conventional sapphire substrate. Moreover, the present invention is able to project light to two sides of the substrate 1. Therefore, the LED light core structure of the present invention is applicable to the existent specification of the conventional fluorescent lamp tube and incandescent bulb to improve the shortcomings of the wolfram filament electrodes of the conventional fluorescent lamp tube and incandescent bulb. Therefore, the present invention breaks through the limitation of the conventional LED lighting angle.

Figure 5:
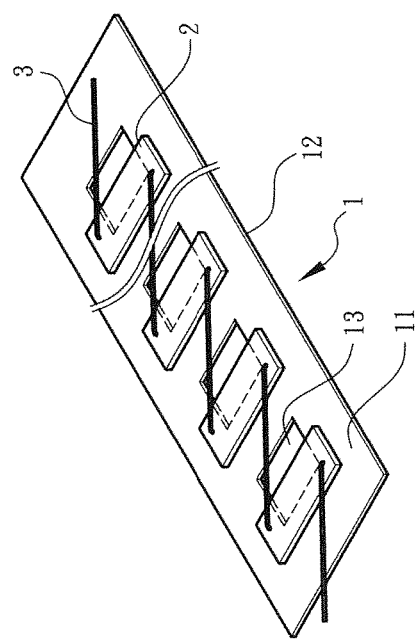
FIG. 5 is a perspective view according to FIG. 1, showing a modified embodiment of the present invention.

Please refer to FIG. 5. In a modified embodiment, the two faces 11, 12 of the substrate 1 are formed with multiple openings 13 at intervals. The LEDs 2 are respectively disposed on the face 11 of the substrate 1 between the adjacent openings 13. In addition, the LEDs 2 are at least partially bridged over the openings 13, whereby the parts of the LEDs 2 that are positioned on the openings 13 can project light to both sides of the substrate 1.

Figure 6:
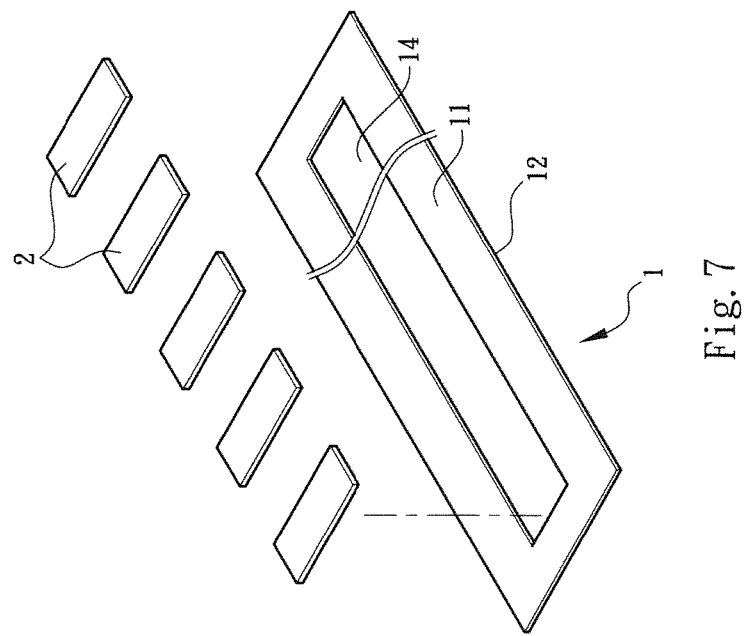
FIG. 6 is a perspective view according to FIG. 1, showing another modified embodiment of the present invention.
Figure 7:
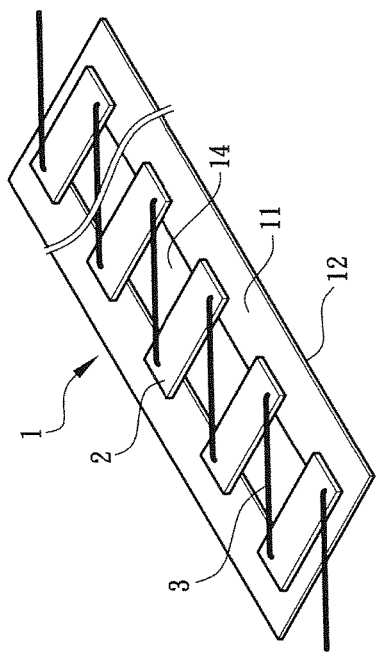
FIG. 7 is a perspective exploded view according to FIG. 6.

Please refer to FIG. 6. In another modified embodiment, the two faces 11, 12 of the substrate 1 are formed with one single elongated opening 14 extending in a lengthwise direction of the substrate 1. Two ends of the LEDs 2 are bridged between two edges of the opening 14 and the LEDs 2 are arranged in the lengthwise direction of the opening 14 at intervals. Under such circumstance, the middle sections of the LEDs 2 are positioned on the opening 14 to project light to both sides of the substrate 1. The leads 3 are connected between the LEDs 2 and bridged over the opening 14.

Figure 9:
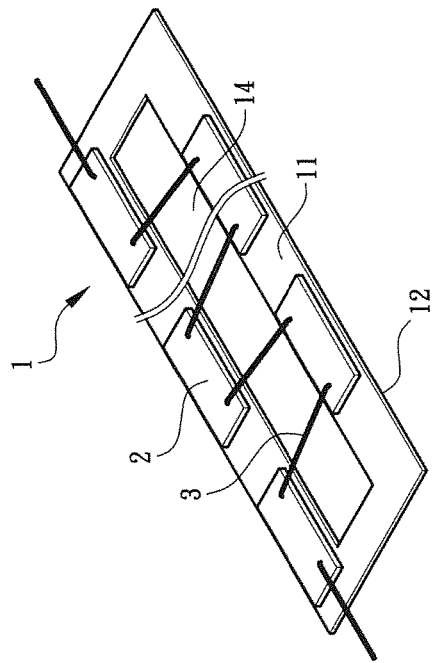
FIG. 9 is a perspective view according to FIG. 1, showing still another modified embodiment of the present invention.
Figure 8:
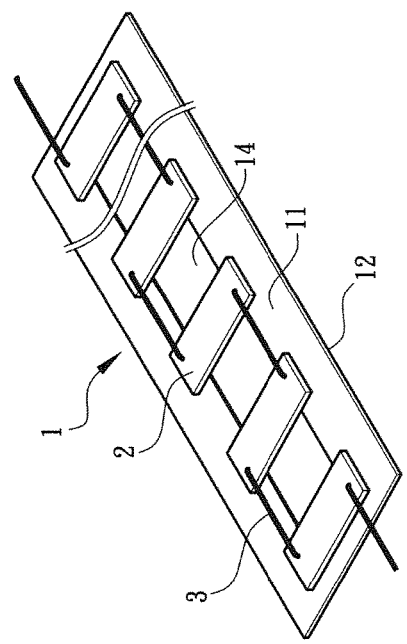
FIG. 8 is a perspective view according to FIG. 1, showing still another modified embodiment of the present invention.

Please refer to FIG. 8. In still another modified embodiment, the arrangement direction of the anodes and cathodes of the LEDs 2 is such adjusted that the leads 3 are positioned along the edges of the opening 14. Please refer to FIG. 9. In still another modified embodiment, the LEDs 2 are arranged on the edges of the opening 14 and the leads 3 are bridged over the opening 14 and arranged along the edges of the opening 14.

According to the above arrangement, the LED light core structure formed of the metal substrate 1 has better mechanical strength and good heat dissipation effect. Moreover, the LED light core structure is able to 360-degree project light and is applicable to the existent specification of the conventional fluorescent lamp tube and incandescent bulb. Therefore, the conventional light core structure formed of the wolfram filament of the incandescent bulb can be directly replaced with the present invention to save energy and meet the requirement of environmental protection. Moreover, the relative positions of the LEDs 2 and the openings 13, 14 and the arrangement form of the leads 3 can be modified according to the requirements so as to provide various illumination forms.

The above embodiments are only used to illustrate the present invention, not intended to limit the scope thereof. Many modifications of the above embodiments can be made without departing from the spirit of the present invention.

What is claimed is:

1. An LED light core structure comprising a substrate having at least two faces, the substrate being formed with at least one opening communicating the two faces, LEDs being disposed on at least one of the two faces of the substrate at the opening, whereby the light emitted from the LEDs disposed on one of the two faces of the substrate can be projected through the opening to the opposite face of the substrate, wherein the substrate is formed with multiple openings arranged on the substrate at intervals, each LED being disposed on the face of the substrate between two adjacent openings.

2. The LED light core structure as claimed in claim 1, wherein the substrate is disposed in a lamp tube, a light cap being disposed at each of two ends of the lamp tube, each light cap having two conductive terminals electrically connected to the LEDs.

3. The LED light core structure as claimed in claim 2, wherein the conductive terminals of the light caps are respectively positioned on the two opposite faces of the substrate.

4. The LED light core structure as claimed in claim 1, wherein the LEDs are at least partially bridged over the openings.

5. The LED light core structure as claimed in claim 1, wherein two ends of the LEDs are respectively bridged between two edges of the opening.

6. The LED light core structure as claimed in claim 1, wherein the LEDs are arranged on the face of the substrate at equal intervals.

7. The LED light core structure as claimed in claim 1, wherein the LEDs are arranged on the face of the substrate at unequal intervals.

8. The LED light core structure as claimed in claim 1, wherein the substrate and the LEDs are enclosed in an enclosure layer containing fluorescent powder.

9. An LED light core structure comprising a substrate having at least two faces, the substrate being formed with at least one opening communicating the two faces, LEDs being disposed on at least one of the two faces of the substrate at the opening, whereby the light emitted from the LEDs disposed on one of the two faces of the substrate can be projected through the opening to the opposite face of the substrate, wherein the LEDs are arranged on the face of the substrate at equal intervals.

10. The LED light core structure as claimed in claim 9, wherein the substrate is disposed in a lamp tube, a light cap being disposed at each of two ends of the lamp tube, each light cap having two conductive terminals electrically connected to the LEDs.

11. The LED light core structure as claimed in claim 10, wherein the conductive terminals of the light caps are respectively positioned on the two opposite faces of the substrate.

12. The LED light core structure as claimed in claim 9, wherein the LEDs are at least partially bridged over the openings.

13. The LED light core structure as claimed in claim 9, wherein two ends of the LEDs are respectively bridged between two edges of the opening.

14. The LED light core structure as claimed in claim 9, wherein the substrate and the LEDs are enclosed in an enclosure layer containing fluorescent powder.

15. An LED light core structure comprising a substrate having at least two faces, the substrate being formed with at least one opening communicating the two faces, LEDs being disposed on at least one of the two faces of the substrate at the opening, whereby the light emitted from the LEDs disposed on one of the two faces of the substrate can be projected through the opening to the opposite face of the substrate, wherein the substrate and the LEDs are enclosed in an enclosure layer containing fluorescent powder.

16. The LED light core structure as claimed in claim 15, wherein the substrate is disposed in a lamp tube, a light cap being disposed at each of two ends of the lamp tube, each light cap having two conductive terminals electrically connected to the LEDs.

17. The LED light core structure as claimed in claim 16, wherein the conductive terminals of the light caps are respectively positioned on the two opposite faces of the substrate.

18. The LED light core structure as claimed in claim 15, wherein the LEDs are at least partially bridged over the openings.

19. The LED light core structure as claimed in claim 15, wherein two ends of the LEDs are respectively bridged between two edges of the opening.

20. The LED light core structure as claimed in claim 15, wherein the LEDs are arranged on the face of the substrate at unequal intervals.

\* \* \* \* \*